(12) United States Patent
Sugiyama et al.

(10) Patent No.: US 6,191,432 B1
(45) Date of Patent: *Feb. 20, 2001

(54) SEMICONDUCTOR DEVICE AND MEMORY DEVICE

(75) Inventors: Naoharu Sugiyama, Yokohama; Atsushi Kurobe, Yamato, both of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/921,550

(22) Filed: Sep. 2, 1997

(30) Foreign Application Priority Data

Sep. 2, 1996 (JP) .................................. 8-232085
May 21, 1997 (JP) .................................. 9-131013

(51) Int. Cl.$^7$ .................................. H01L 29/06
(52) U.S. Cl. .................................. 257/19; 257/20; 257/192
(58) Field of Search .................................. 257/14, 15, 18, 257/19, 20

(56) References Cited

U.S. PATENT DOCUMENTS

| | | | |
|---|---|---|---|
| 5,021,839 | * 6/1991 | Yamazaki | 357/4 |
| 5,336,904 | * 8/1994 | Kusunoki | 257/23 |
| 5,385,853 | 1/1995 | Noor | 437/41 |
| 5,534,713 | 7/1996 | Ismail | 257/24 |

OTHER PUBLICATIONS

Electron Mobility Enhancement in Strained–Si N–Type Metal–Oxide–Semiconductor Field–Effect Transistors, by J. Welser, J. L. Hoyt, and J. F. Gibbons, *IEEE Electron Device Letters*, vol. 15, No. 3, Mar. 1994 (3 pgs.).

Strained–Si heterostructure field effect transistors, by C. K. Maiti, L.K. Bera, and S. Chattopadhyay, Semicond. Sci. Technol. 13 (1998) 1225–1246.

* cited by examiner

*Primary Examiner*—Sara Crane
(74) *Attorney, Agent, or Firm*—Oblon, Spivak, McClelland, Maier & Neustadt, P.C.

(57) ABSTRACT

A semiconductor device includes a superlattice having a first semiconductor layer having a first band-gap, a second semiconductor layer having a band-gap narrower than the first band-gap, the superlattice having a band structure with an energy level of a conduction band of the second semiconductor layer being lower than an energy level of a conduction band of the first semiconductor layer and an energy level of a valence band of the second semiconductor layer being lower than an energy level of a valence band of the first semiconductor layer, or a band structure with an energy level of a conduction band of the second semiconductor layer being higher than an energy level of a conduction band of the first semiconductor layer and an energy level of a valence band of the second semiconductor layer being lower than an energy level of a valence band of the first semiconductor layer, an exposed face formed on a plane different from a plane orientation on which the superlattice is formed, an end face of the superlattice being exposed to the exposed face, and a channel being formed on the exposed face.

12 Claims, 10 Drawing Sheets

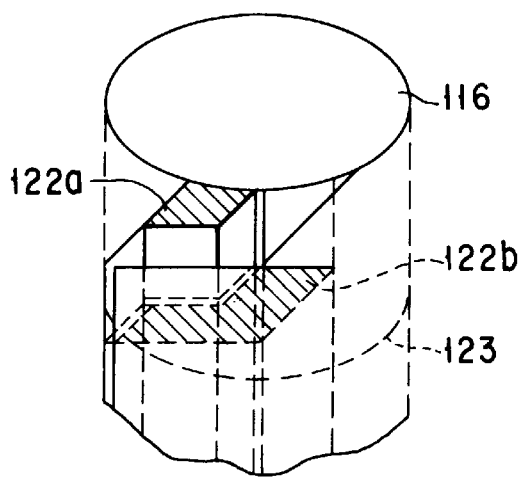 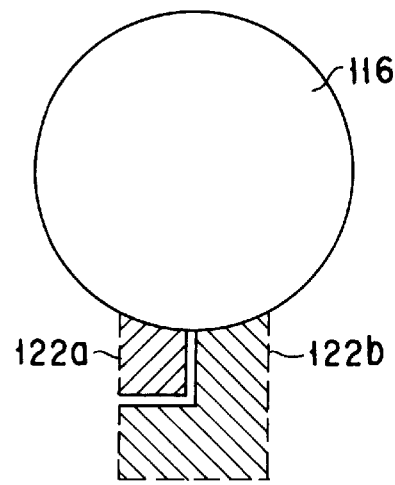
F I G. 14A   F I G. 14B
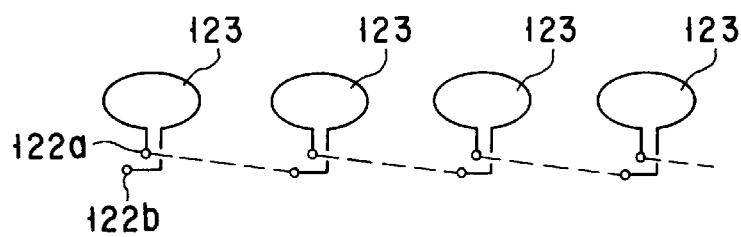
F I G. 15
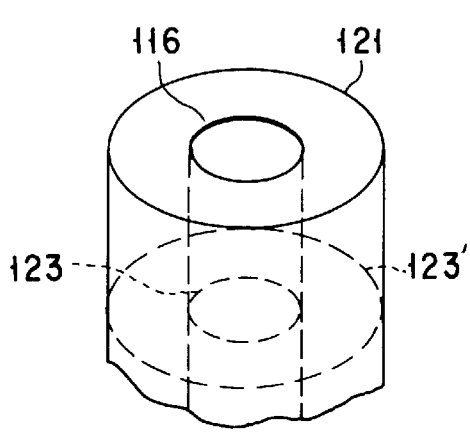 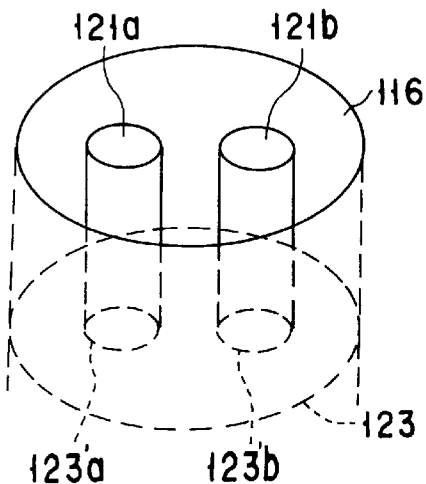
F I G. 16   F I G. 17

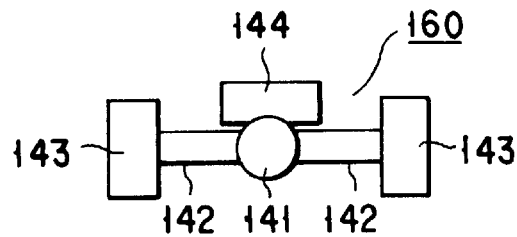
F I G. 23
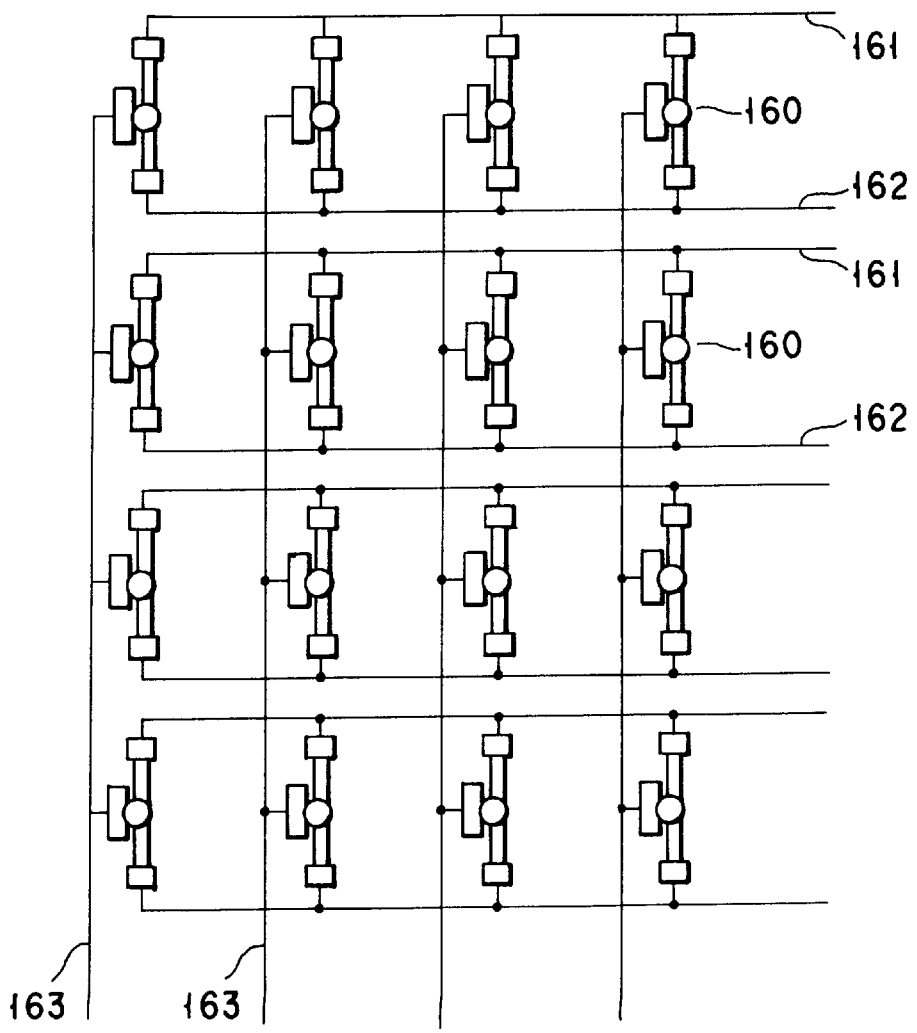
F I G. 24

SEMICONDUCTOR DEVICE AND MEMORY DEVICE

BACKGROUND OF THE INVENTION

The present invention relates to a semiconductor device having a fine structure, and in particular to a fine annular quantum wire structure which can be integrated, and a semiconductor device and a memory device using it.

Various semiconductor elements using silicon single crystals as a fundamental material are used widely and commonly. For enhancing the performance of these semiconductor elements, it is one of effective means to increase the transit speed (mobility) of electrons transiting in the material. The upper limit value of the mobility of electrons in single crystals is determined by physical property factors, and the upper limit value cannot be improved by the structure. In recent years, however, the fact that the mobility of electrons in a silicon crystal having strain is increased as compared with the original silicon crystal has been reported.

In a common method for fabricating such elements, a crystal slightly differing in lattice constant from the silicon crystal is prepared and thereon a silicon layer thinner than the critical film thickness is formed by using a thin film growing technique as means for providing the silicon crystal with a strain. To be concrete, a SiGe alloy crystal layer having a Ge composition of approximately 30% as an alloy crystal having lattice constants slightly greater than silicon is prepared, and thereon a silicon thin film layer having a thickness of 100 nm or less is formed. (In this case, lattice constants of the SiGe crystal are greater than those of the Si crystal by approximately 1.2%.) At this time, it is difficult to procure an inexpensive SiGe crystal substrate which is industrially mass-produced and which is excellent in quality. Usually, therefore, a silicon wafer is used as a substrate, and thereon SiGe having a sufficient thickness (thicker than the critical film thickness) is formed to obtain a crystal which is slightly greater in lattice constant than Si.

The Si layer thus formed is subjected to tensile strain. As a result, not only the mobility of electrons is improved, but also there is obtained such an advantage that the potential position of the conduction band is moved to a lower position as compared with the SiGe layer by the effect of the tensile strain and consequently electrons can be stored more easily. There is an example in which n-type MOSFETs and MODFETs were fabricated by way of trial by using such characteristics. On the other hand, for improving the mobility of holes, it is more advantageous to use a SiGe layer having compressive strain as compared with the Si layer having tensile strain fabricated as described above. In other words, a SiGe layer with no strain relaxation caused becomes necessary in this case.

For thus forming a p-type MOSFET (or MODFET) with a hole mobility increased by using the strain of a crystal, there is required a thin film layer structure (modulated dope structure) different from that in the case where the n-type MOSFET (MODFET) is formed. In other words, for forming a CMOS incorporating both an n-type FET and a p-type FET, layered structures suited for both the n-type FET and the p-type FET need to be formed separately. Therefore, conventional hetero devices had a big problem in integration.

In a quantum confined structure, electrons or holes are confined in an extremely small area in a semiconductor material (to be concrete, an area having dimensions shorter than the wavelength of electrons). Such a quantum confined structure has unique characteristics which cannot be obtained in conventional semiconductors. Therefore, its fabrication results by way of trial using various methods have been reported. Above all, a quantum well structure can be easily formed. In the case of the quantum well structure, a layer is formed from two kinds of semiconductors having different band gaps and quantum confinement is conducted in only one direction. A large number of examples of application thereof have been reported.

As for a quantum wire structure with quantum confinement conducted in two directions and a quantum box structure with quantum confinement conducted in all of three-dimensional directions, it is difficult to form them and reports of them are few.

BRIEF SUMMARY OF THE INVENTION

An object of the present invention is to provide a structure which allows a p-type MOSFET and an n-type MOSFET to be simultaneously formed by using a system increased in mobility by the effect of strain.

Another object of the present invention is provide a ring-shaped quantum wire structure formed by using an existing silicon process, and a semiconductor device using such a structure. To be concrete, a semiconductor device suitable for a change magnetic field measuring instrument and a high frequency modulator, and a memory device requiring no holding power are provided.

In accordance with the present invention, the following measures are taken.

In accordance with an essential aspect of the present invention, a layered structure of Si and SiGe incorporating a strain is formed, and thereafter there is formed a trench or a mesa, on which a gate oxide film is formed.

A semiconductor device according to a first aspect of the present invention is characterized by comprising a superlattice comprising a first semiconductor layer having a first band-gap, a second semiconductor layer having a band-gap narrower than the first band-gap, the superlattice having a band structure with an energy level of a conduction band of the second semiconductor layer being lower than an energy level of a conduction band of the first semiconductor layer and an energy level of a valence band of the second semiconductor layer being lower than an energy level of a valence band of the first semiconductor layer, or a band structure with an energy level of a conduction band of the second semiconductor layer being higher than an energy level of a conduction band of the first semiconductor layer and an energy level of a valence band of the second semiconductor layer being higher than an energy level of a valence band of the first semiconductor layer; an exposed face formed on an orientation different from an orientation on which the superlattice is formed, an end face of the superlattice being exposed to the exposed face; and a channel selectively formed on the exposed face. In other words, a semiconductor device according to the first aspect of the present invention has a superlattice structure called type II.

Preferred embodiments of a semiconductor device according to the present invention are as follows:

(1) A first field effect transistor having a channel formed by storing electrons in a semiconductor layer having a lower energy potential of a conduction band included in the first semiconductor layer and the second semiconductor layer forming the superlattice, and a second field effect transistor having a channel formed by storing holes in a semiconductor layer having a lower energy potential of a valence band included in the first semiconductor layer and the second semiconductor layer forming the superlattice are formed together.

(2) The first semiconductor layer comprises silicon, or an alloy crystal of silicon and germanium, and the second semiconductor layer comprises an alloy crystal of silicon and germanium having a higher germanium content ratio as compared with the first semiconductor layer, or germanium.

(3) The first semiconductor layer comprises silicon, or an alloy crystal of silicon and germanium, the silicon or an alloy crystal of silicon and germanium containing a tensile strain, and the second semiconductor layer comprises an alloy crystal of silicon and germanium having a higher germanium content ratio as compared with the first semiconductor layer, or germanium, the alloy crystal of silicon and germanium, or germanium containing a compressive strain.

(4) A device further comprises a first electrode disposed on one end of the channel of the exposed face, and a second electrode disposed on the other end of the channel of the exposed face.

According to the first aspect of the present invention, the above described semiconductor device can be fabricated by the following procedure. First of all, on a semiconductor substrate, a material having different lattice constants is formed as a layer to form a superlattice structure. Thereafter, a trench is formed so as to penetrate the superlattice portion. After gate oxide films have been formed on wall faces of this trench, a gate portion (electrode) is formed. If in this case a mesa is to be formed instead of the trench, a superlattice is exposed by etching. In the case of the Schottky gate structure, the gate oxide film is unnecessary.

As described above, the layered structure of the Si and the SiGe incorporating the strain is formed, and thereafter the gate oxide film is formed on the trench or the mesa in accordance with the first aspect of the present invention. As a result, an increase of electron mobility is obtained in the strained Si layer, and an increase of hole mobility is obtained in the strained SiGe layer.

A semiconductor device according to a second aspect of the present invention characterized by comprising a semiconductor substrate having a quantum well layer exposed annularly; and a first electrode disposed to be insulated from the quantum well layer, wherein when a voltage is applied to the first electrode, a conduction channel region which becomes a quantum wire is formed on the exposed face of the quantum well layer exposed annularly. In this case, a superlattice structure called type I may also be used. The semiconductor substrate has a trench, and consequently the quantum well layer is exposed annularly. A device further comprises a second electrode connected to one end of the conduction channel region, and a third electrode connected to the other end of the conduction channel region. The semiconductor substrate has a plurality of trenches and a plurality of first electrodes associated with the trenches, a conduction channel region is formed in each of the plurality of trenches, and a second electrode connected to one end of the conduction channel region and a third electrode connected to the other end of the conduction channel region are formed; the third electrode of an arbitrary one of the plurality of trenches and the second electrode of an adjacent trench are connected together by conductor wiring; and when a voltage is applied to the plurality of first electrodes, the plurality of conduction channel regions are connected in series via the third electrode, the conductor wiring, and the second electrode to form inductance. The semiconductor substrate has a columnar projection, and consequently the quantum well layer is exposed annularly.

A semiconductor device according to the second aspect of the present invention is characterized by comprising a semiconductor substrate having at least one island-shaped region and a trench, a quantum well layer being exposed annularly on all side faces of the trench; and an electrode formed within the trench, the electrode being disposed to be insulated from the semiconductor substrate having at least one island region, wherein when a voltage is applied to the electrode, a conduction channel region which becomes a quantum wire is formed on the exposed face of the quantum well layer exposed annularly.

Another semiconductor device according to the second aspect of the present invention is characterized by comprising a semiconductor projection formed on a semiconductor substrate, the semiconductor projection having a quantum well layer inside; a first electrode formed on a side face of the semiconductor projection to be insulated from the side face of the semiconductor projection; at least one trench formed on an upper face of the semiconductor projection so as to expose the quantum well layer annularly; and a second electrode formed in the trench to be insulated from the semiconductor projection, wherein when a voltage is applied to the first electrode or the second electrode, an annular conduction channel region which becomes a quantum wire is formed on a face of the quantum well layer opposed to an electrode subjected to voltage application and included in the first electrode and the second electrode.

A still another semiconductor according to the second aspect of the present invention is characterized by comprising a semiconductor substrate having a quantum well layer inside; a wiring conductor formed on the semiconductor substrate; and a magnetic substance having at least one end embedded as far as a position deeper than the quantum well layer of the semiconductor substrate, wherein when a voltage is applied to the magnetic substance, an annular conduction channel region which becomes a quantum wire is formed on an end face of the quantum well layer opposed to the magnetic substance and insulated from the magnetic substance. The depth of the annular conduction channel region is controlled by a voltage applied to the magnetic substance.

According to the present invention, a magnetic material formed so as to surround a wiring material passes through a quantum ring (annular quantum wire). When an alternating current (high frequency current) flows through the wiring material, therefore, a current is let flow through the quantum ring by a magnetic field generated in the magnetic material. The magnetic field is affected by this current. As a result, resistance is caused against the alternating current flowing through the wiring material. The resistance caused against the alternating current differs depending upon the frequency. Therefore, the resistance serves as a filter for removing a specific frequency component, or as a tuner for passing through a specific frequency.

The depth of the conduction channel for forming the quantum ring can be controlled by using the gate voltage. Thereby the inductance changes. Therefore, it becomes possible to control the subject frequency.

Conventional high frequency filters have large capacitance of wiring material and the like, and are disadvantageous especially for a high frequency region. In the present invention, however, the wiring portion can be formed on the semiconductor substrate by using the fine processing technique, and consequently a filter having extremely small electric capacitance can be formed.

A semiconductor device according to a third aspect of the present invention is characterized by comprising a semiconductor substrate having a quantum well layer inside; a magnetic substance embedded in the semiconductor substrate as far as a position deeper than a depth of the quantum well layer from a surface of the semiconductor substrate, the magnetic substance being insulated from the semiconductor substrate; voltage applying means for supplying a voltage to the magnetic substance and thereby forming an annular conduction channel region around the magnetic substance; magnetizing means for magnetizing the magnetic substance; and detection means for detecting a magnetization state of the magnetic substance by letting flow a current through the conduction channel.

Another semiconductor device according to the third aspect of the present invention is characterized by comprising a semiconductor substrate having a quantum well layer inside; a trench formed on a surface of the semiconductor substrate as far as a position deeper than a depth of the quantum well layer; a magnetic substance formed in the trench; two main gate electrodes formed linearly in positions on the semiconductor substrate opposed to each other across the trench; source-drain regions formed in positions on the semiconductor substrate opposed to each other across the two gate electrodes in series; and an auxiliary gate electrode formed on the semiconductor substrate to be adjacent to the trench and to be close to the two main gate electrodes, wherein when a voltage is applied to the magnetic substance, an annular quantum wire which becomes a conduction channel is formed on an end face of the quantum well layer opposed to the magnetic substance.

A memory device according to the third aspect of the present invention is characterized by comprising a semiconductor substrate having a quantum well layer inside; a plurality of MOS-type semiconductor devices arranged on the semiconductor substrate in a matrix form; a plurality of pairs of feeding lines, each of the feeding lines extending in a row direction, each of the feeding lines being connected in common to source-drain regions of the MOS-type semiconductor devices arranged on a same row; and a plurality of auxiliary gate lines, each of the auxiliary gate lines extending in a column direction, each of the auxiliary gate lines being connected in common to auxiliary gate electrodes of the MOS-type semiconductor devices arranged on a same column, each of the plurality of MOS-type semiconductor devices comprising: a trench formed on a surface of the semiconductor substrate as far as a position deeper than a depth of the quantum well layer; a magnetic substance formed in the trench; source-drain regions formed in positions on the semiconductor substrate opposed to each other across the two gate electrodes in series; and an auxiliary gate electrode formed on the semiconductor substrate so as to be adjacent to the trench and so as to be close to the two main gate electrodes, wherein when a voltage is applied to the magnetic substance, an annular quantum wire which becomes a conduction channel is formed on an end face of the quantum well layer opposed to the magnetic substance, and wherein information writing/reading is conducted by controlling a potential of the auxiliary gate electrode via an associated one of the auxiliary gate lines and controlling or sensing a magnetization state of the magnetic substance.

According to the third aspect of the present invention, there is provided a function of magnetizing the magnetic material embedded in the center of a MOS-type semiconductor device, or reading the magnetism of the magnetic material, and consequently a memory device requiring no holding power can be fabricated.

As described above, the present invention makes it possible to store electrons (or holes) of high mobility using the quantum effect in a channel region and apply it to MOSFETs. In addition, it becomes possible to fabricate both the p-type FET and n-type FET finely by using comparatively simple means. By using a system increased in mobility by the effect of the strain, a structure allowing both the p-type MOSFET and the n-type MOSFET to be fabricated simultaneously can be provided.

It becomes possible to form a novel quantum wire structure in which the quantum confinement is conducted in an annular form. By forming this annular quantum wire structure on the substrate, various applications described below become possible. the quantum wire structure of the present invention, the magnetic material formed so as to surround the wiring material passes through the inside of a quantum ring. By the magnetic field generated in the magnetic material when an alternating current (high frequency current) flows through the wiring material, therefore, a current flows through the quantum ring. The magnetic field of the magnetic material is affected by this current. As a result, resistance is caused against the alternating current flowing through the wiring material.

The resistance caused against the alternating current differs depending upon the frequency. Therefore, the resistance serves as a filter for removing a specific frequency component, or as a tuner for passing through a specific frequency. The depth of the conduction channel for forming the quantum ring can be controlled by using the gate voltage. Thereby the inductance changes. Therefore, it becomes possible to control the subject frequency.

Conventional high frequency filters have large capacitance of wiring material and the like, and are disadvantageous especially for a high frequency region. In the present invention, however, the wiring portion can be formed on the semiconductor substrate by using the fine working technique, and consequently a filter having extremely small electric capacitance can be formed.

Or by providing a function of magnetizing the magnetic material located in the center of the annular wire, or a function of reading the magnetism of the magnetic material, a memory device requiring no holding power can be fabricated.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWINGS

The accompanying drawing, which are incorporated in and constitute a part of the specification, illustrate presently preferred embodiments of the present invention and, together with the general description given above and the detailed description of the preferred embodiments given below, serve to explain the principles of the present invention in which:

FIGS. 14A and 14B are diagrams for explaining how to take a quantum ring electrode in an annular wire structure of cylindrical trench type, in which FIG. 14A is an oblique view, and FIG. 14B is a plan view;

FIG. 15 is a schematic diagram for explaining an example in which annular wire structures of cylindrical trench type are coupled in series;

FIG. 16 is a schematic oblique view for explaining an example in which an annular wire structure formed by a cylindrical trench is surrounded by an annular wire structure formed by a columnar projection;

FIG. 17 is a schematic oblique view for explaining an example in which two annular wire structures formed by two columnar projections are surrounded by an annular wire structure formed by one cylindrical trench;

FIG. 23 is a plan view of the memory device in the stage of FIG. 22D; and

FIG. 24 is a concept diagram for explaining an example in which a memory device according to the seventh embodiment has been integrated.

DETAILED DESCRIPTION OF THE INVENTION

Figure 1:
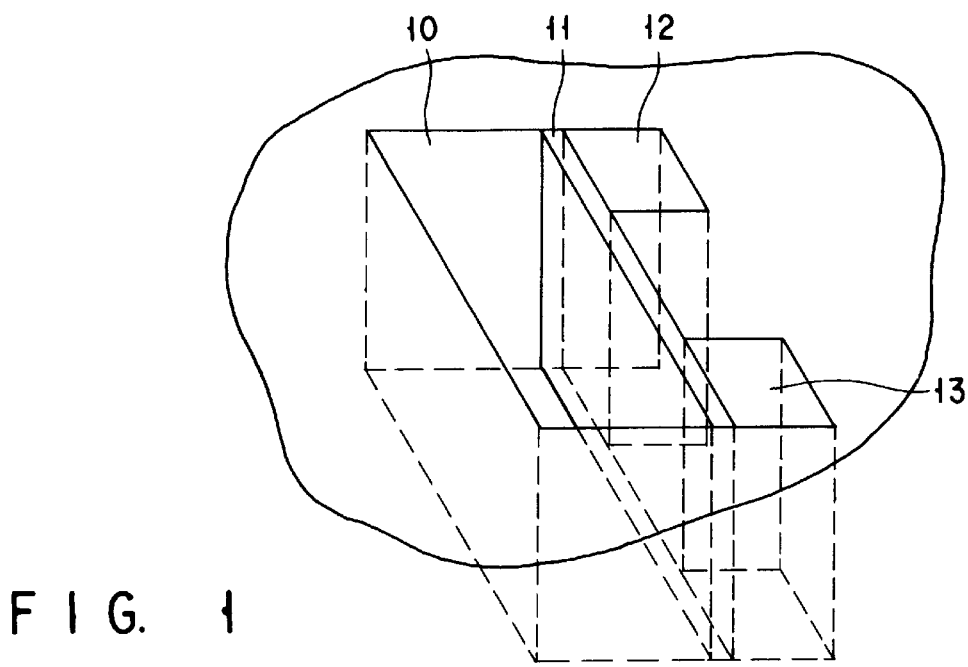
FIG. 1 is a schematic diagram of a first embodiment of a semiconductor device according to the present invention.

Preferred embodiments of the present invention will be described by referring to the drawing.

FIG. 1 is a schematic diagram of a first embodiment of a semiconductor device according to the present invention.

In the present invention, a trench 10 is formed on a substrate containing a thin film epitaxial layer (not illustrated) which has a layered structure of Si and SiGe on a silicon substrate. By oxidizing the side face of the trench 10 and forming an oxide film, a gate oxide film is formed. On ends of the trench 10, a source portion 12 and a drain portion 13 are formed by using the ion implantation. In FIG. 1, a source electrode and a drain electrode formed so as to be located across a gate electrode and said trench 10 from the source portion 12 and the drain portion 13 are omitted.

Figure 2A:
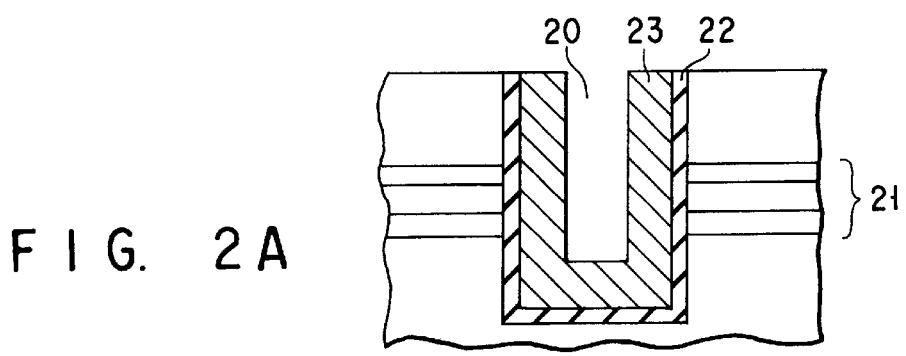
FIGS. 2A to 2C are a sectional view and plan views of the first embodiment of a semiconductor device (MOSFET) according to the present invention.
Figure 2B:
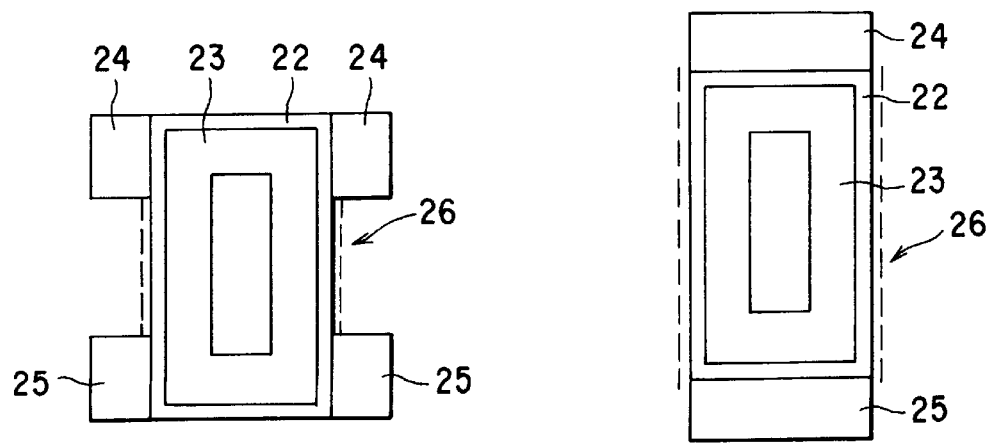
Figure 2C:
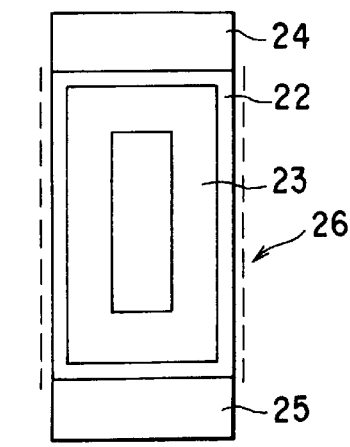

FIGS. 2A to 2C are a sectional view and plan views of a first embodiment of a semiconductor device (MOSFET) according to the present invention.

As shown in FIG. 2A, a trench 20 is formed from the surface as far as a depth of, for example, 100 nm inclusive of a superlattice 21 formed by a Si layer and a SiGe layer. Thereafter, oxide films 22 are formed on side walls of the trench 20 to form gate oxide films. After the oxide films 22 have been formed, low-resistance polycrystal silicon 23 with a dopant added is formed so as to be embedded in the trench 20 and is used as a gate electrode. In FIG. 2B, two sources 24 and two drains 25 are formed with the trench 20 in between. As shown in FIG. 2C, however, it is also possible to set the areas of ion implantation so that the two sources (or drains) will be continuous together. As for the fabrication procedure of the MOSFET shown in FIGS. 2A to 2C, it is desirable to prescribe the source-drain regions beforehand by using the ion implantation and then form the trench 20.

Figure 3:
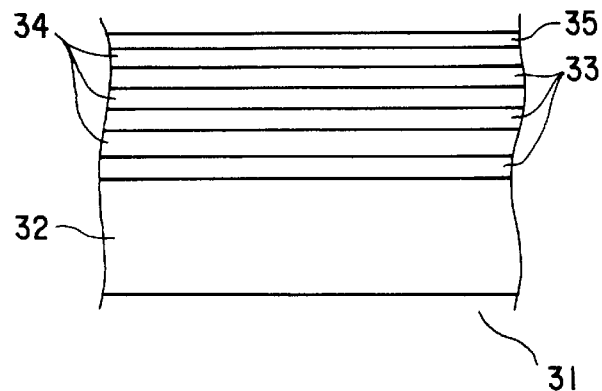
FIG. 3 is a sectional view of a layered structure of SiGe/Si formed on a silicon substrate.

FIG. 3 shows a sectional view of a layered structure of SiGe/Si formed on a silicon substrate. On a (100) Si substrate 31, a SiGe layer having a Ge composition of 30% (SiGe, X=0.3) is grown to have a thickness of 2 $\mu$m. At this time, the Si layer of the substrate is different in lattice constant from the SiGe layer grown as the thin film. As a result, strain is caused in the SiGe layer. If the thickness is as large as 2 $\mu$m, however, then the SiGe layer cannot afford to store the lattice strain and a dislocation is generated, the formation being thus relaxed. As a result, the SiGe (X=0.3) layer has larger lattice constants than the Si crystal. If the thickness of the SiGe (X=0.3) layer is as large as 2 $\mu$m, then the possibility that the dislocation propagates to the Si layer grown on the SiGe (X=0.3) layer or a SiGe layer having a different composition diminishes. On the lattice-relaxed SiGe (X=0.3) layer, three periods each formed by a Si layer 33 having a thickness of 10 nm and a SiGe (X=0.5) layer 34 are piled up. As the top layer, a Si layer 35 having a thickness of 5 nm is formed.

Figure 4A:
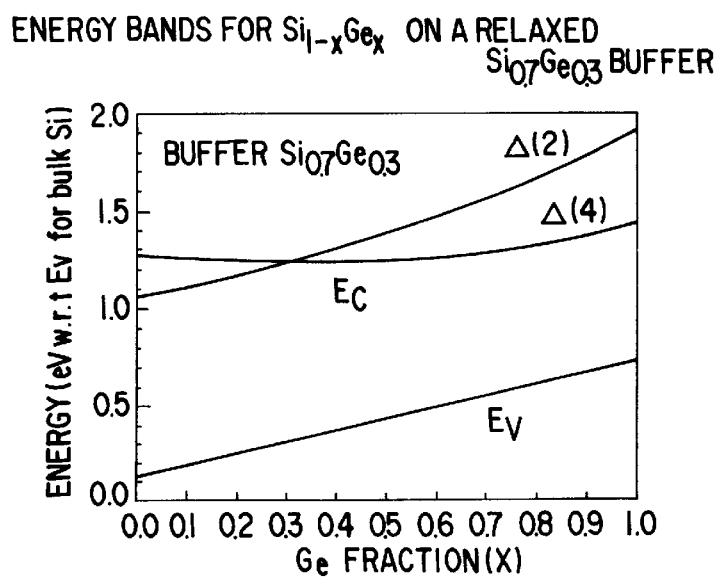
FIGS. 4A and 4B are diagrams for explaining the band structure of a superlattice layer.

What kind of band structure the superlattice having the structure of FIG. 3 has will now be described by referring to FIGS. 4A and 4B. On a (100) Si layer, a lattice-relaxed SiGe (X=0.3) layer is formed, and thereon a lattice-relaxed SiGe (X=0.3) layer having an arbitrary Ge composition is further formed. FIG. 4A shows energy positions of the valence band and the conduction band at this time. The energy position of the valence band is Ev. Among energies of the conduction band, the valley in a direction perpendicular to the substrate is denoted by $\Delta(2)$, and the valley in a horizontal direction with respect to the substrate is denoted by $\Delta(4)$. As for the valence band, band discontinuity is caused therein, in both the case where a SiGe layer having a Ge composition of 50% and a compression strain is formed on a layer having a Ge composition of 30% and the case where a Si layer which does not contain Ge and which has a tensile strain is formed on the layer having the Ge composition of 30%. As for the conduction band, however, electrons are stored from the lower end of the band. Therefore, it is found that band discontinuity is caused in the case where the Si layer having the tensile strain is formed on the layer having the Ge composition of 30%, whereas little band discontinuity is caused in the case where the SiGe layer having the Ge composition of 50% and the compression strain is formed on the layer having the Ge composition of 30%.

Figure 4B:
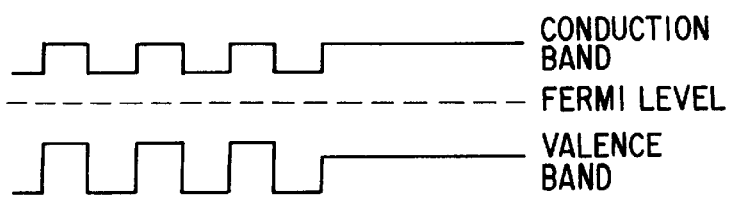

FIG. 4B is a band diagram of a layered structure shown in FIG. 3. Over a thick SiGe (X=0.3) layer relaxed to large lattice constants, a thin Si layer having smaller lattice constants than the SiGe layer and a SiGe (X=0.5) layer having large lattice constants are formed. In the thin film layers, therefore, a tensile strain and a compression strain are stored, respectively. As described before, the Si layer in this configuration serves as a quantum well layer for electrons, and the SiGe layer functions as a barrier layer for electrons. On the other hand, the SiGe layer serves as a quantum well layer for holes, and the Si layer serves as a barrier layer for holes. In other words, there is obtained a superlattice structure called type II in which electrons tend to be stored in the Si layer on the conduction band side and holes tend to be stored in the SiGe layer in the valence band.

Figure 5A:
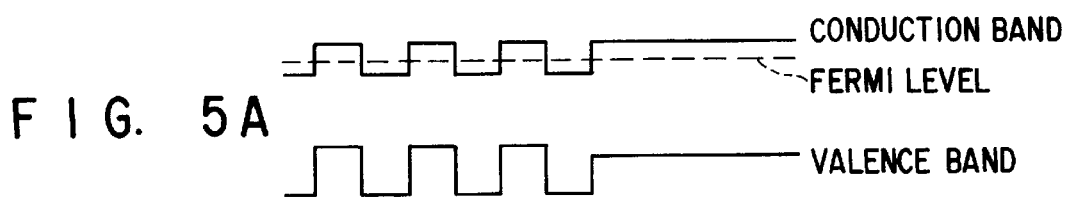
FIGS. 5A and 5B are diagrams showing band deformation in the case where a positive or negative voltage is applied to a gate electrode of a semiconductor device according to the present invention.
Figure 5B:
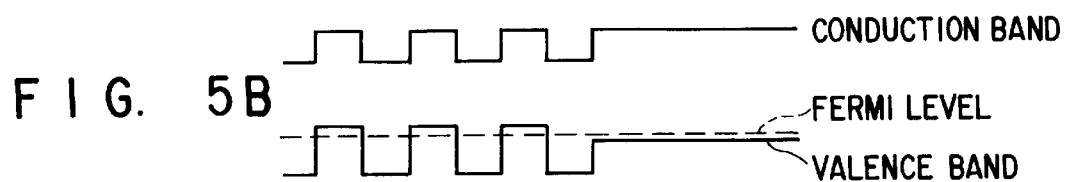

FIGS. 5A and 5B schematically show the band deformation caused near the gate when the trench 20 is formed in the thin film structure, the gate oxide films are formed on the wall faces of the trench 20, and a positive voltage (FIG. 5A) or a negative voltage (FIG. 5B) is applied to the gate electrode. It is understood that electrons are stored in the Si layer when the positive voltage is applied and holes are stored in the SiGe layer (X=0.5) when the negative voltage is applied.

As described above, a p-type MOSFET and an n-type MOSFET can be easily formed from the same thin film structure.

Figure 6A:
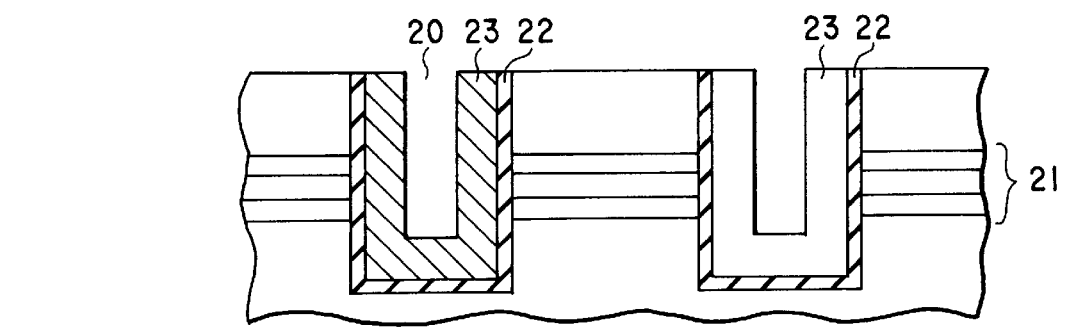
FIGS. 6A and 6B are diagrams showing a second embodiment of a semiconductor device according to the present invention.
Figure 6B:
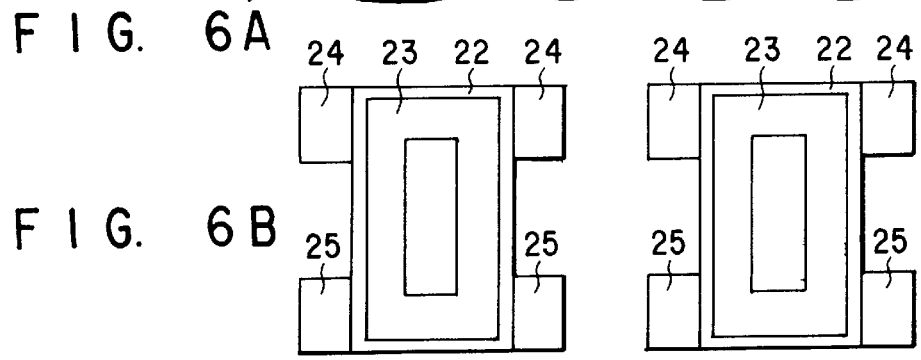

FIGS. 6A and 6B are diagrams showing a second embodiment of a semiconductor device according to the present invention, and show an example in which a plurality of trenches 20 are formed and a p-type MOSFET and an n-type MOSFET are fabricated simultaneously. In FIGS. 6A and 6B, the same portions as those of FIGS. 2A through 2C are denoted by like numerals and detailed description thereof will be omitted. FIG. 6A is a sectional view, and FIG. 6B is a plan view. As shown in FIGS. 5A and 5B, the layer in which holes in the p-type are stored is different from the layer in which electrons in the n-type. In FIGS. 6A and 6B, therefore, it becomes possible to diminish the probability of occurrence of break down due to the potential difference between a trench 20 for the p-type and a trench 20 for the n-type even in the case where the position of the trench 20 for the p-type is caused to approach the position of the trench 20 for the n-type. In other words, it becomes possible to fabricate a p-type MOSFET and an n-type MOSFET in a smaller area. It thus becomes possible to fabricate a circuit having a high degree of integration.

In this configuration, a high electron (or hole) mobility is obtained because the strained crystal is used as a channel. Besides the effect, the following effect makes it possible to provide device operating at a higher switching speed. In other words, carriers stored in respective layers are confined in a narrow area surrounded by potential barriers, and consequently quantum wires are formed in a direction pointed from the source to the drain in FIG. 1 or FIG. 2B. As a result, the probability of scattering of electrons or holes in the channel can be lowered. Accordingly, a MOSFET operating at a higher frequency can be formed.

Figure 7A:
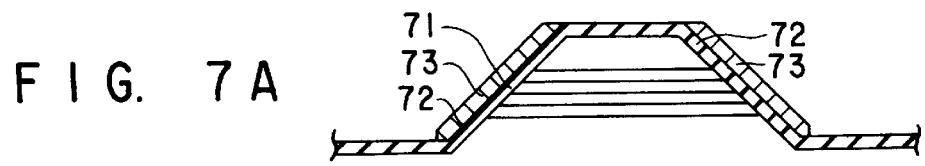
FIGS. 7A and 7B are diagrams showing a third embodiment of a semiconductor device according to the present invention.
Figure 7B:
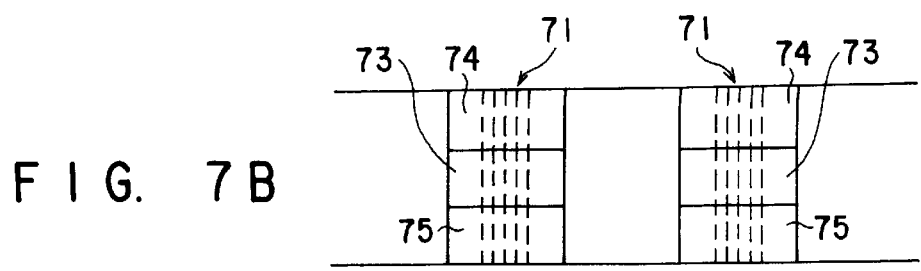

FIGS. 7A and 7B are a sectional view and a plan view showing a third embodiment of a semiconductor device according to the present invention, and show an example in which the gate is formed not in the trench 20 but on the mesa face. A substrate on which a Si/SiGe superlattice 71 has been formed is subjected to mesa etching. After the superlattice face has been exposed, the front face is covered by an oxide film 72. Then, a low-resistance polycrystal silicon layer 73 is formed by deposition, and it is removed excepting the gate area. Finally, a source portion 74 and a drain portion 75 are formed. The procedure is the same as that of the conventional MOSFET fabrication process. In this configuration, a p-type MOSFET and an n-type MOSFET can be formed on both ends of the mesa. As the number of the repetitive periods of the Si/SiGe thin film layer becomes greater, the number of quantum wires becomes great and the channel efficiency becomes high. However, it is necessary to conduct the design so that the layer thickness will become a thickness releasing the strain or less. It is also possible to make the thickness of the strain-relaxed SiGe layer thin by using a SOI (Silicon On Insulator) substrate.

In the case where the SiGe layer exposed to the mesa face is directly oxidized to form the gate oxide film in FIGS. 7A and 7B, it is necessary to pay attention to the quality of the oxide film of SiGe. A method of forming the gate oxide film by exposing the mesa face, thereafter forming the Si layer by deposition so as to have a thickness of approximately 5 nm, and oxidizing the Si layer is effective. This holds true for the case of the trench 20 as well.

Heretofore, the present embodiment has been described by taking the Si/SiGe material as an example. Even if a compound semiconductor material having a band diagram of a similar combination other than this material is used, however, similar effects are obtained. So long as the material combination has band discontinuity of the type II in the same way as the Si/SiGe system as in GaAs/InGaAs system, similar effects are obtained. In a combination, such as AlGaAs/GaAs system, having band discontinuity of type I, both the layer in which p-type MOSFET carriers are stored and the layer in which n-type MOSFET carriers are stored become layers of materials of narrow band gaps. In this case as well, the effects of the present invention are obtained nearly in the same way. Heretofore, examples of using the MOS structure as the method for forming the gate portion have been shown. In the Schottky gate and the junction gate structure as well, however, similar effects are obtained.

It is also possible to fabricate an element including a combination of Si having a tensile strain and SiGe having a compressive strain by using a configuration in which the gate 73 is formed on the top face of the mesa in FIGS. 7A and 7B. For example, Si and SiGe having a Ge composition of 30% are used as a superlattice, and SiGe having a Ge composition of 15% is used for the gate layer. At this time, in the Si layer included in the superlattice, the position of the conduction band becomes lower than that of the gate layer and electrons become apt to be stored. In the SiGe layer, the position of the valence band becomes higher than that of the gate layer and holes become apt to be stored.

In the above described embodiment, the mesa is formed by forming the superlattice and exposing the end (oblique) face by mesa etching. Instead, the superlattice may be exposed after the mesa has been formed by using the selective growth method.

Figure 8:
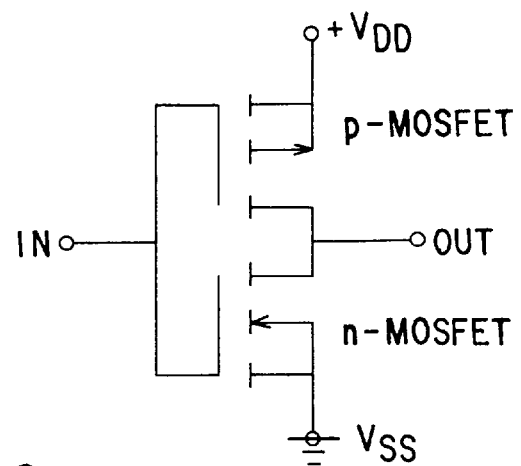
FIG. 8 is a schematic diagram of a CMOS inverter circuit.

An example in which a CMOS inverter and a transmission circuit serving as fundamental circuit of a CMOS are fabricated will now be described. FIG. 8 shows a schematic diagram of a CMOS inverter circuit. This CMOS inverter circuit includes a combination of a p-type MOSFET and an n-type MOSFET. The p-type MOSFET and the n-type MOSFET has a common gate, and drains of them are short-circuited. Schematic diagrams of the case where this circuit is fabricated according to the present invention are shown in FIGS. 9A and 9B.

Figure 9A:
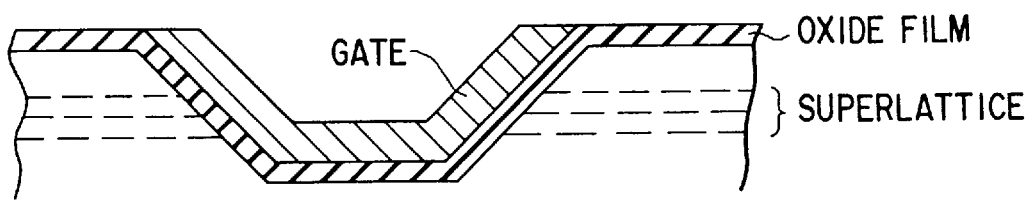
FIGS. 9A and 9B are schematic diagrams o f the case where the CMOS inverter circuit of FIG. 8 has been fabricated according to the present invention.

FIG. 9A shows a schematic sectional view of the element. With reference to FIG. 9A, a mesa trench is formed on a substrate including a Si/SiGe superlattice and the end face of the superlattice is exposed, and a p-type MOSFET and an n-type MOSFET are formed on both side faces of the mesa trench, respectively. Dopants are added to portions corresponding to the sources and drains of respective MOSFETs beforehand by ion implantation. In other words, an n-type dopant is added in the case associated with the n-type MOSFET, and a p-type dopant is added in the case associated with the n-type MOSFET. In this way, the polarity of the MOSFET can be controlled by the kind of the dopant added beforehand to the source-drain position. Ion implantation of the dopant may be conducted either after forming the mesa trench or before forming the mesa trench.

Figure 9B:
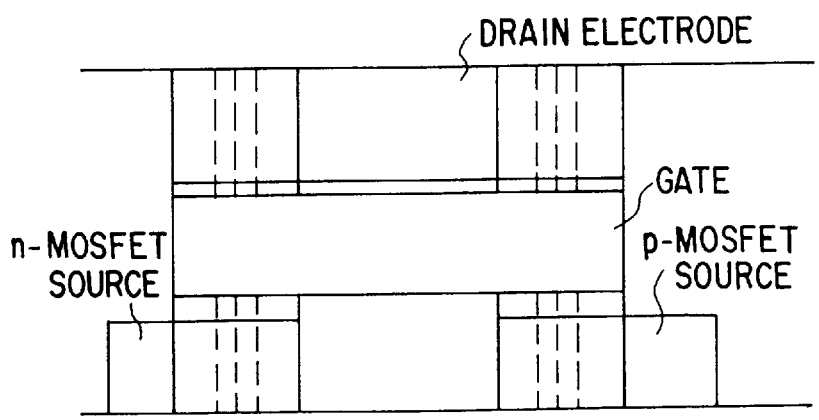

FIG. 9B shows the plan view of a created CMOSFET. With reference to FIG. 9B, the CMOS inverter can be fabricated by making the gate electrode of the p-type MOSFET and the gate electrode of the n-type MOSFET common and connecting the drain electrodes together.

Figure 10:
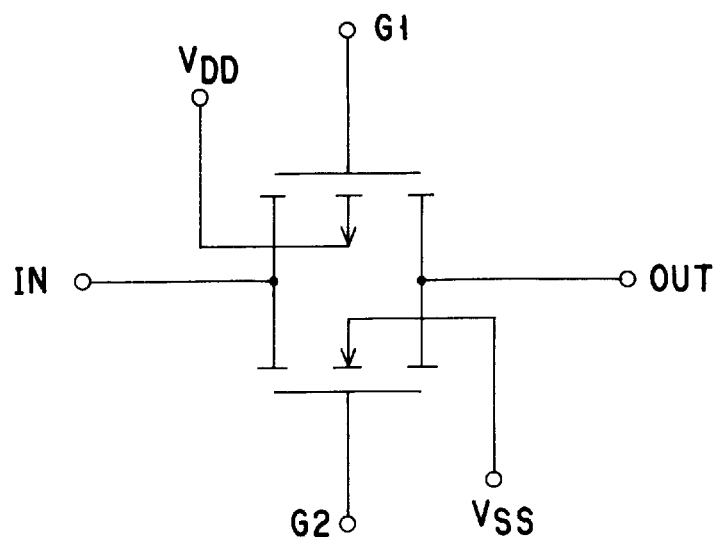
FIG. 10 is a schematic diagram of a CMOS transmission circuit.
Figure 11A:
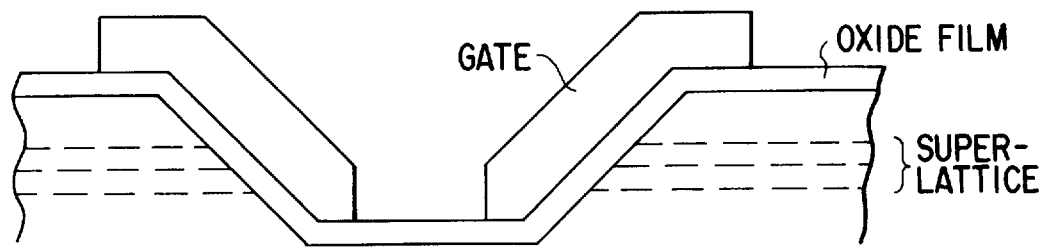
FIGS. 11A and 11B are schematic diagrams of the case where the CMOS transmission circuit of FIG. 10 has been fabricated according to the present invention.
Figure 11B:
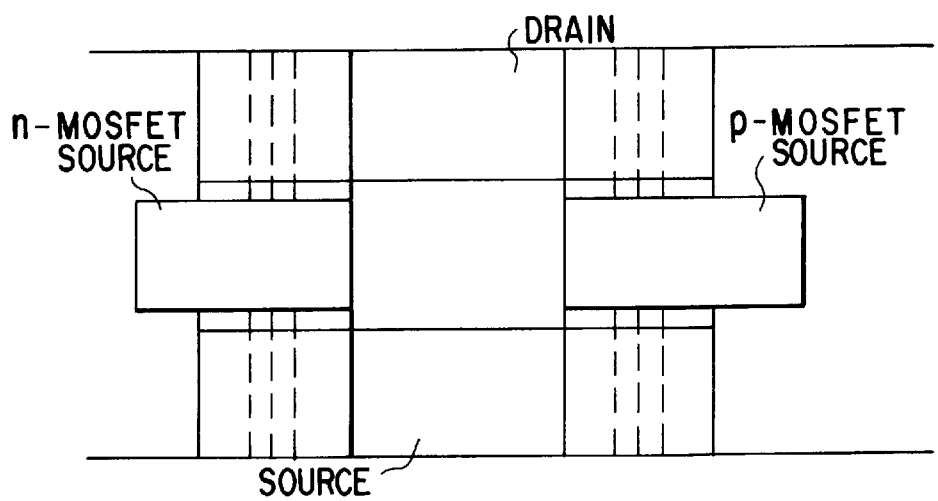

FIG. 10 shows a schematic diagram of a CMOS transmission circuit. In this circuit, sources and drains of the p-type MOSFET and the n-type MOSFET are short-circuited, respectively. Schematic diagrams of the case where this circuit is fabricated according to the present invention are shown in FIGS. 11A and 11B. In FIGS. 11A and 11B, FETs are formed on both end faces of the mesa trench in the same way as the example of the inverter circuit. The fabrication procedure is the same as the above described inverter circuit. As shown in FIG. 11B, the transmission circuit can be fabricated by making the gate electrodes independent and short-circuiting the source electrodes and the drain electrodes, respectively.

As described above, a CMOSFET capable of operating at a high rate can be easily fabricated by using the present invention.

Figure 12A:
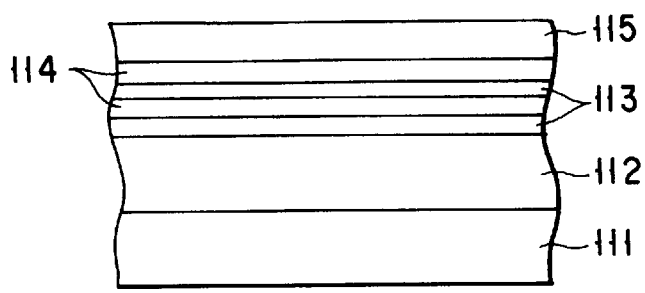
FIGS. 12A to 12C are sectional views showing the fabrication procedure of a semiconductor device having an annular quantum wire structure according to a fifth embodiment of the present invention.
Figure 12B:
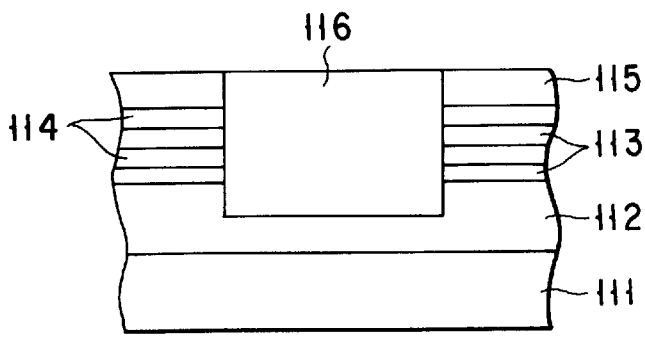
Figure 12C:
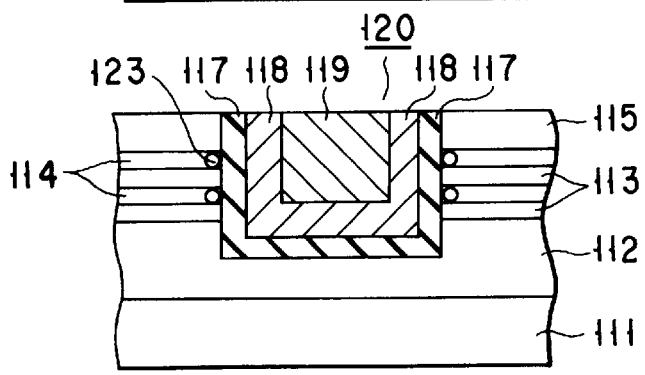

FIGS. 12A to 12C are sectional views of a semiconductor device, which schematically show a fundamental procedure of the case where a semiconductor device having an annular quantum wire (quantum ring) structure according to a first embodiment of the present invention is fabricated.

First of all, a lattice-relaxed SiGe crystal thin film 112 is grown on a silicon substrate 111. The germanium composition is 30%, and the thickness is 2 µm. Instead of forming the layer of the germanium composition of 30% directly on the silicon substrate 111, such a structure of layers that the density of germanium is gradually increased may be employed. As a result, the quality of the SiGe (30%) layer which is the top layer can be improved.

On the lattice-relaxed SiGe layer 112, two silicon (Si) layers 113 each having a thickness of 5 nm and two SiGe (50%) layers 114 each having a thickness of 5 nm are formed. At this time, each of the Si layers 113 is subjected to a tensile strain and each of the SiGe (50%) layers 114 is subjected to a compressive strain. On the superlattice, a Si layer 115 having a thickness of 10 nm is formed as a cap layer (FIG. 12A).

If in this case the sum total of the Si layers 113 and the SiGe (50%) layers 114 forming the superlattice becomes thick, the strain cannot be contained within the superlattice and lattice relaxation occurs. As a result, it becomes difficult to fabricate the structure intended by the present invention.

For the superlattice having such a structure, a cylindrical trench 116 is formed by etching (FIG. 12B). In the present embodiment, a trench having a diameter of 50 nm and a depth of 30 nm is formed. After forming the cylindrical trench 116, an SiO2 layer 117 having a thickness of 10 nm is formed by using the CVD method. As a result, walls of the cylindrical trench 116 are covered by SiO2. Thereafter, a polycrystal silicon layer 118 containing phosphorous as a dopant and an aluminum layer 119 are formed by deposition. By leveling the surface, an aluminum electrode 120 including the polycrystal silicon layer 118 and the aluminum layer 119 is formed (FIG. 12C).

If a voltage is applied to the electrode portion 120 in the trench structure thus formed, a conduction channel region can be formed along side faces of the cylindrical trench 116. For example, in the case where a positive voltage is applied, a conduction channel region is formed along the Si layer subjected to the tensile strain and electrons are stored therein. In the case where a negative voltage is applied, an annular conduction channel region is formed along the SiGe (50%) layer 114 and holes are stored therein. In other words, ring-shaped quantum wires 123 can be formed on the side faces of the cylindrical trench 116. FIGS. 12A to 12C show an example in which ring-shaped quantum wires 123 have been formed in the SiGe layer 114.

In the above described embodiment shown in FIGS. 12A to 12C, a ring structure capable of storing electrons or holes as occasion demands according to the selection of the applied voltage can be formed by forming the Si layer 113 subjected to tensile strain and the SiGe (50%) layer 114 subjected to compressive strain. Instead, a ring capable of storing only either electrons or holes can also be formed by simplifying the layered structure.

Figure 13:
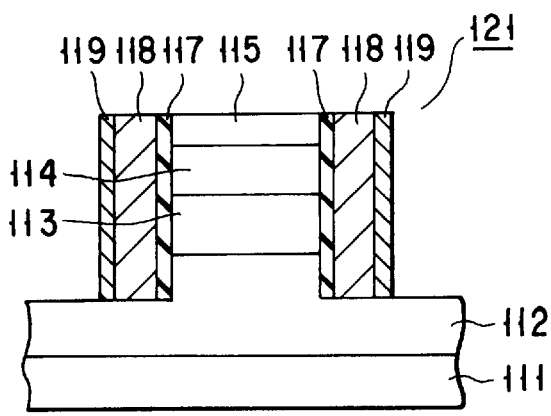
FIG. 13 is a sectional view of a semiconductor device for explaining a variant of the fifth embodiment in which an annular wire structure is formed on a side face of a columnar projection.

Instead of forming the conduction channel region on the side faces of the cylindrical trench, the conduction channel region may also be formed on the side faces of a columnar projection. FIG. 13 shows a sectional view of the case where a ring storing electrons has been formed on side faces of a columnar projection 121. Portions corresponding to those of FIGS. 12A to 12C are denoted by like numerals and detailed description thereof will be omitted. A strained silicon layer 113 is formed so as to have a thickness of 10 nm.

In this case, it is important that the quantum wires formed on the side faces are closed in both the pillar structure and the structure utilizing the side walls of the trench. The sectional shape of the pillar or the trench need not necessarily be circular.

FIGS. 14A and 14B are schematic diagrams showing an example of how to take the electrode in the case where a quantum ring 123 is formed with a cylindrical trench type. FIG. 14A is an oblique view, and FIG. 14B is a plan view. A layered structure (not illustrated) forming quantum wires is formed by using the thin film growth technique. Thereafter, an electrode portion serving as pull-out electrodes 122a and 122b of quantum wires is embedded and formed beforehand by ion implantation so as to be adjacent to the side face of the formed cylindrical trench 116.

Subsequently, the cylindrical trench 116 is formed by etching. At the same time, the electrode portion is also cut and divided into two ends by etching, electrodes 122a and 122b being thus formed. At this time, the annular portion in which quantum wires are formed is also cut, and brought to such a state that the electrodes 122a and 122b are connected to both ends thereof, respectively. If a level difference is provided between the electrodes 122a and 122b and such a structure that one of the electrodes will project than the other of the electrodes is adopted as shown in FIG. 14A, it is advantageous in the case where a plurality of quantum rings formed by cylindrical trenches are connected in series.

FIG. 15 schematically shows an example in which a plurality of quantum rings 123 formed on cylindrical trenches are connected in series. Since a plurality of quantum rings 123 formed in the same winding direction are connected in series in the same magnetic field, an element having the same function as conventional coils can be implemented.

In the present embodiment, a common gate electrode 120 for forming the quantum ring 123 is provided in the center of each cylindrical trench 116. By using a bias voltage applied to this gate electrode 120, the depth of the conduction channel region forming the quantum ring 123 can be controlled. Therefore, it becomes possible to effectively change the internal resistance of the coil by changing this bias voltage. In other words, the inductance can be adjusted by controlling the internal resistance. Therefore, this property can be applied to detection of electromagnetic wave and the like.

FIG. 16 shows an example of a configuration in which a quantum ring 123 formed by a cylindrical trench 116 is surrounded by a quantum ring 123' formed by a columnar projection 21. In this configuration, a changing voltage is applied to the gate electrode of one of the quantum rings, and a modulation is supplied to a current flowing through the quantum ring. By doing so, a change in magnetic field occurs, and the change magnetic field can be transmitted to the other of the quantum rings. In this case, such a structure that the quantum ring formed by the columnar projection is surrounded by the quantum ring formed by the cylindrical trench can also be fabricated.

FIG. 17 shows an example in which two quantum rings 123'a and 123'b formed by two columnar projections 121a and 121b are surrounded by one large quantum ring 123 formed by one cylindrical trench 116. If in this configuration signals respectively having independent modulations are applied to the two quantum rings 123'a and 123'b surrounded by the large quantum ring 123, it is possible to take out signals with the modulation signals of those two kinds added from the large quantum ring.

Figure 18A:
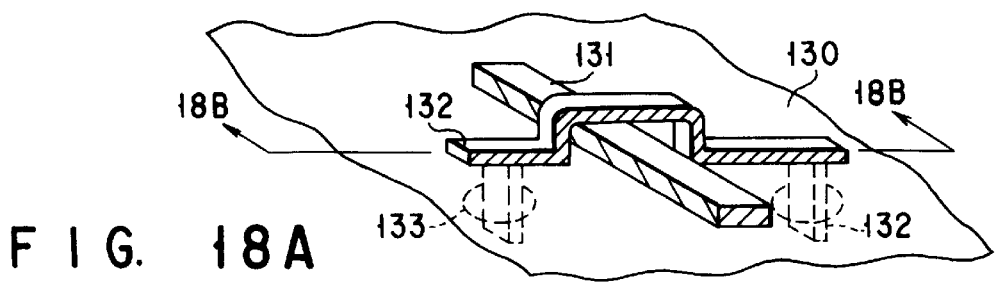
FIGS. 18A to 18C are diagrams for explaining the element structure of a semiconductor device according to a sixth embodiment of the present invention.

FIG. 18A is an oblique view of a semiconductor element structure according to a sixth embodiment of the present invention. A magnetic material (magnetic substance) 132 is formed on the same semiconductor substrate 130 to surround a wiring material (conductor wiring) 131 formed on a semiconductor substrate 130. In this case, the wiring material 131 is electrically insulated from the magnetic material 132. Both ends of the magnetic material 132 are branched to pass through quantum rings 133 formed in the semiconductor substrate 130.

If in such a structure an alternating current is let flow through the wiring material 131, a change of the magnetic field according to a change of the current occurs in the magnetic material 132. Since the change of the magnetic field passes through the quantum ring 133, a current change occurs in the quantum ring 133. The current change caused in the quantum ring 133 exerts an influence upon the magnetic field change in the magnetic material 132 and supplies a resistance component to the alternating current in the wiring material 131.

Figure 18B:
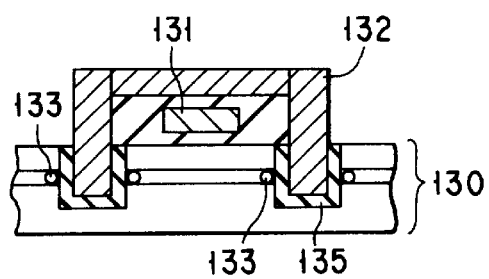
Figure 18C:
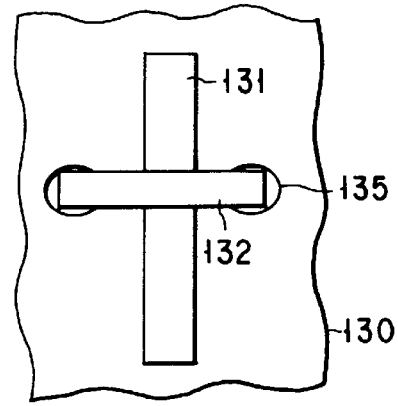

FIG. 18B is a sectional view seen along a line 18B—18B of FIG. 18A. FIG. 18C is a plan view of FIG. 18A. In the present embodiment, each of ends of the magnetic material 132 passes through its associated quantum ring 133. Even if only one end passes through the quantum ring 133, however, a similar effect is obtained.

The present embodiment is formed by a combination of a single wiring material 131 and a single magnetic material 132 perpendicular to the wiring material 131. However, it is possible to combine a plurality of magnetic materials with a single wiring material. In this case, the property with respect to the alternating current flowing in the wiring material can be determined for each of combinations of the magnetic materials and the quantum rings.

FIGS. 19A to 19D are sectional views showing a procedure for fabricating the semiconductor element structure of the present embodiment.

Figure 19A:
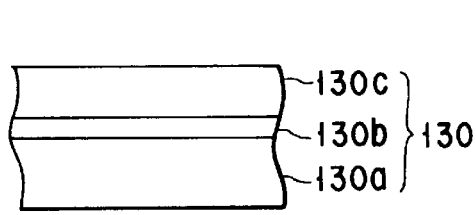
FIGS. 19A to 19D are sectional views of a semiconductor device for explaining by stages a method for fabricating the element structure of FIGS. 18A to 18C.

First, a thin film layer 130b of SiGe (Ge composition 30%) serving as a quantum well layer is formed on a silicon substrate 130a. On the thin film layer 130b, a silicon cap layer 130c is formed (FIG. 19A). This three-layer structure corresponds to the substrate 30 of FIGS. 18A to 18C. In this case, it is desirable that the SiGe layer 130b has such a thickness as not to relax the crystal strain. In the present embodiment, the SiGe layer 130b has a thickness of 8 nm. The cap layer 130c has a thickness of 20 nm.

Figure 19B:
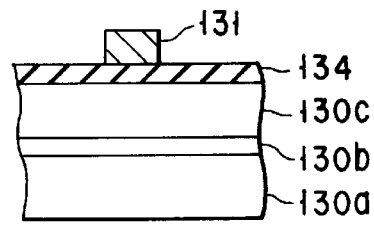

The surface of 10 nm of the cap layer 130c is subjected to thermal oxidation to form an oxide film 134. Thereafter, aluminum is evaporated as the wiring material 131. While leaving only the wiring portion, unnecessary portions are removed by etching (FIG. 19B).

Figure 19C:
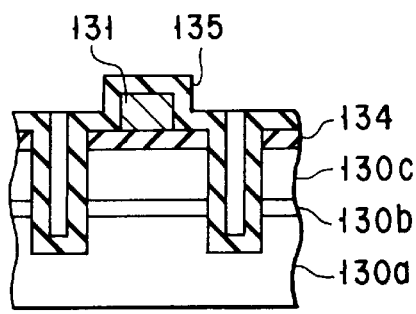

In the semiconductor substrate 130 located on both sides of the wiring material 131, trenches are formed. As for the trench depth, such a depth as to pass through the SiGe layer 130b of the substrate thin film layer is sufficient. After forming the trenches, the substrate surface including the internal faces of the trenches and the wiring material is protected by an SiO2 film 135. The SiO2 film 135 is formed by using the CVD method (FIG. 19C). The oxide film 135 on the internal face of each of the trenches serves as an oxide film layer for forming the conduction channel.

Figure 19D:
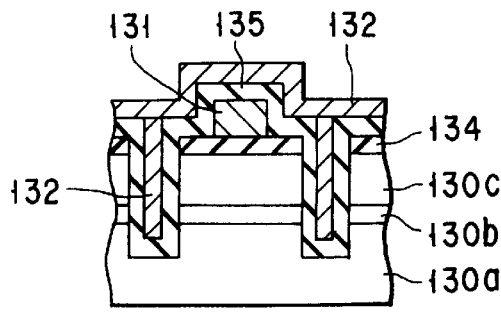

Finally, the magnetic material 132 is formed by the evaporation method (FIG. 19D). At this time, it is necessary for the magnetic material 132 to penetrate deeper than the SiGe layer 130b in the trench. As the magnetic material 132, iron is used. In the same way as the wiring material, unnecessary portions are removed by etching after evaporation. For the magnetic material, electrodes which are not illustrated are provided so as to be able to apply a voltage thereto.

In the present embodiment, the SiGe layer 130b sandwiched between the silicon layers 130a and 130c is used for forming annular quantum wires. Even in a strained silicon layer sandwiched between lattice-relaxed SiGe layers, however, a similar structure can be formed. It is also effective to employ a plurality of annular quantum wires by using a multi-layer structure.

Figure 20A:
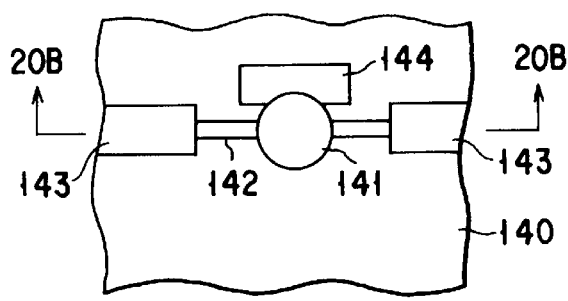
FIGS. 20A and 20B are diagrams for explaining a memory device using a semiconductor device according to a seventh embodiment of the present invention.
Figure 20B:
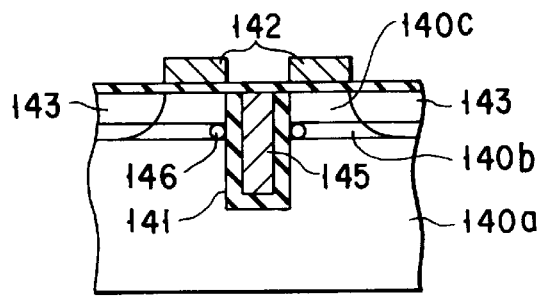

FIGS. 20A and 20B are diagrams for explaining a memory device using a quantum ring according to a seventh embodiment of the present invention. FIG. 20A is a plan view thereof. FIG. 20B is a sectional view seen along a line 20B—20B of FIG. 20A.

On a substrate 140, gate electrodes 142 are formed on both ends by using the MOS structures so as to have a trench 141 forming the quantum ring between. On both ends of the gate electrodes, source-drain regions 143 are formed. As for the substrate 140, a thin film layer 140b of SiGe (Ge composition of 30%) serving as the quantum well layer is formed on a silicon substrate 140a in the same way as the sixth embodiment. Thereon, a silicon cap layer 140c is formed.

On one side of the MOS structure (main gate electrodes) 142 arranged in a linear form, an auxiliary gate electrode 144 is formed so as to be adjacent to the trench 141. In the trench forming the quantum ring, a magnetic material 145 is embedded. This magnetic material 145 serves as a gate electrode (trench gate) for bringing the quantum ring to the on-state (such a state that a conduction channel is formed on internal walls of the trench and an annular quantum wire 146 is formed in the SiGe layer 140b).

In this element, the magnetic material 145 embedded in the trench is magnetized and the magnetism is read. Thereby, a memory device which does not use power to hold the memory can be formed.

The memory method of the above described memory device will now be described briefly.

First, all of the main gate electrode 142, the trench gate electrode 145, the auxiliary gate electrode 144 are brought to the on-state, and a voltage is applied to the source-drain region 143 (i.e., a current is let flow through the source-drain region 143). The current mainly flows to the auxiliary gate electrode 144 of the quantum ring. As a result, a magnetic field occurs perpendicular to the direction of the current, and the magnetic material 145 in the trench 141 is magnetized.

Subsequently, the auxiliary gate electrode 144 is controlled so as to turn off-state. As a result, a current passes through the quantum ring 146 so as to surround the magnetic material 145. If at this time the magnetic material 145 is already magnetized, the current passing through the quantum ring 146 is subjected to greater resistance by the influence of the magnetic field. This can be observed between the source and the drain as resistance.

This phenomenon is known as Aharonov-Bohm effect (AB effect). For erasing the magnetized magnetic material (erasing the memory), it is necessary to bring the auxiliary gate electrode 144 to the on-state and apply an alternating current to the main gate electrode 142.

In the foregoing description, there has been described an example in which the magnetic material 145 is magnetized in one direction by a current flow using the auxiliary gate electrode 144, the presence/absence of the magnetism is read out by the quantum ring 146, and it is applied to a memory element. However, a method of determining whether the memory is present by using the direction of the magnetism of the magnetic material 145 is also conceivable.

In other words, while the auxiliary gate electrode 144 is in the on-state, the direction of the magnetism of the magnetic material is controlled by the polarity (direction) of the voltage applied between the source and drain of the MOS transistor. If in this case the strength of the magnetic force is equal even if the direction of the magnetism is different, a difference in resistance value does not appear sometimes in readout using a quantum ring having high symmetry. At such a time, it becomes possible to judge the difference in magnetism direction as a difference in presence/absence of memory if the symmetry of the quantum ring is lowered by applying a low voltage to the auxiliary gate electrode at the time of readout as well. Since in this technique it is not necessary to erasing the magnetism for inverting the presence/absence of the memory, the above described alternating current for erasing becomes unnecessary.

Figure 21:
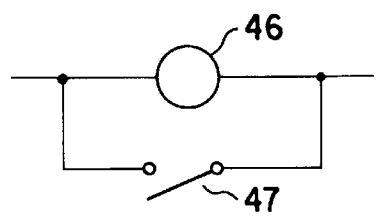
FIG. 21 is an equivalent circuit of the memory device of FIGS. 20A and 20B.

FIG. 21 represents the above described element structure by a schematic circuit. The element structure is represented as a configuration in which a switch 147 is connected in parallel with the quantum ring 146. The switch 147 represents the function of the auxiliary gate 144.

A procedure for fabricating the element shown in FIGS. 20A and 20B will now be described by referring to FIGS. 22A to 22D.

Figure 22C:
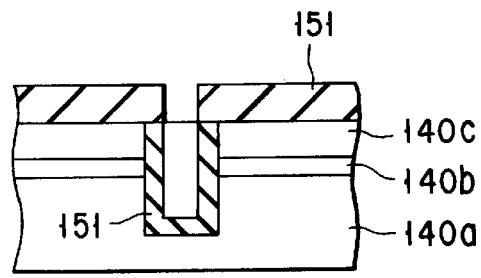
FIGS. 22A to 22D are sectional views of the memory device for explaining by stages a method for fabricating the memory device of FIGS. 20A and 20B.
Figure 22A:
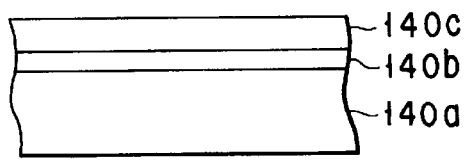

First of all, a quantum well structure for forming the quantum ring is fabricated (FIG. 22A). The present embodiment uses such a structure that the SiGe thin film layer 140b having a germanium composition of 25% and a thickness of 10 nm is sandwiched between the silicon crystal substrate 140a and the silicon layer 140c. However, strained silicon on a lattice-relaxed SiGe layer can also be used. A material other than silicon is also effective.

Figure 22B:
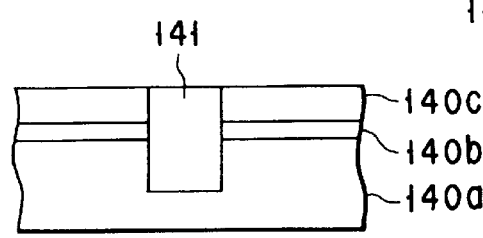

A trench 141 for forming the quantum ring is formed (FIG. 22B). As for the depth of the trench, a depth deeper than the quantum well 140b is sufficient.

On the substrate after trench formation, an oxide film 151 is formed by deposition using the CVD method so as to have a thickness of 100 nm. At this time, the oxide film 151 is formed on the internal walls of the trench 141 as well (FIG. 22C).

Out of the uniformly deposited CVD oxide film 151, only the portions of the main gate electrode and the auxiliary gate electrode are removed by etching. The surface of the silicon layer 140c is thus exposed. Thereafter, the exposed portion is subjected to thermal oxidation to form a thermal oxide film 152'. It is desirable that the thermal oxide film 152' has a thickness nearly equivalent to the thickness (10 nm) of the typical gate oxide film. In this case, it is desirable to form the gate oxide film (thermal oxide film) 152' after removing the CVD oxide film on the internal walls of the trench 141. At this time, the thermal oxide film 152 which is the same as the gate oxide film 152' is formed on the internal walls of the trench 141 (FIG. 22C).

Figure 22D:
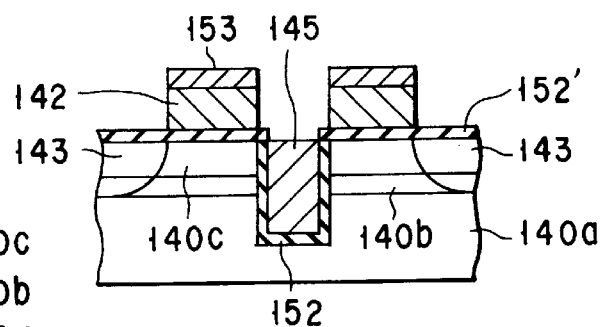

After the gate oxide film 152' has been formed, the polycrystal silicon 142 for gate is formed by deposition, and an electrode 153 is formed. The magnetic material 145 is embedded in the trench. The source and drain region 143 is also formed (FIG. 22D).

FIG. 23 is a plan view of a semiconductor device 160 formed by the above described process.

FIG. 24 shows an example of an integrated memory device formed by arranging a plurality of the semiconductor devices 160. A plurality of (four, in the present embodiment) semiconductor devices 160 are arranged in parallel in the row direction. The source-drain 143 of each semiconductor device 160 is connected to a common source line 161 and a common drain line 162. The main gate electrode and the trench gate electrode of each semiconductor device are respectively connected to a common gate line and a common trench gate line which are not illustrated.

These are arranged in parallel in the column direction to form a plurality of (four, in the present embodiment) parallel groups. There is prepared an auxiliary gate line 163 for coupling the auxiliary gate electrode of one element of each parallel group to the auxiliary gate electrodes of elements of the same column of different parallel groups.

In such an element arrangement, a voltage is applied to one parallel group via the source line 161 and the drain line 162, and a write voltage is applied to an arbitrary auxiliary gate line 163. Thereby, the magnetic material of an arbitrary element can be magnetized (can be subjected to memory writing). By repeating a similar operation to different parallel groups, writing operation can be conducted selectively for all elements.

As for the erase operation, the magnetism of the magnetic substance can be erased by specifying one out of the parallel groups and one out of the auxiliary gate lines to select an arbitrary element and thereafter letting flow an alternating current through the main gate line. In the present description and FIG. 24, wiring for applying voltages to the main gate electrode and the trench gate electrode is omitted. However, it is a matter of course that the wiring can be formed by using the conventional semiconductor fabrication process.

The readout operation is conducted according to the following procedure. In such a state that a voltage is applied to all auxiliary gate lines 63, a voltage is applied between the source line 161 and the drain line 162 of an arbitrary parallel group. At this time, the voltage applied to the parallel group is made sufficiently lower than the voltage applied at the time of writing. Since the auxiliary gate is in the onstate, each element passes into a low resistance state.

If in this state voltages of the auxiliary gate lines 163 are turned off one after another, it becomes possible to grasp the magnetization state of a specific element on the basis of the drain current. In other words, the magnetization state of an arbitrary element can be read out by selecting a combination of a parallel group subjected to the readout voltage and an auxiliary gate line which is subjected (or not subjected) to a reference voltage (off voltage).

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a superlattice comprising a first semiconductor layer having a first band-gap, a second semiconductor layer having a band-gap narrower than said first band-gap, said superlattice having a band structure with an energy level of a conduction band of said second semiconductor layer being lower than an energy level of a conduction band of said first semiconductor layer and an energy level of a valence band of said second semiconductor layer being lower than an energy level of a valence band of said first semiconductor layer, or a band structure with an energy level of a conduction band of said second semiconductor layer being higher than an energy level of a conduction band of said first semiconductor layer and an energy level of a valence band of said second semiconductor layer being higher than an energy level of a valence band of said first semiconductor layer;
   an exposed face formed on a plane different from a plane orientation on which said superlattice is formed, an end face of said superlattice being exposed to said exposed face; and
   a channel selectively formed on said exposed face.

2. A semiconductor device according to claim 1, composing a first field effect transistor having a channel storing electrons in a lower one of conduction band energy potentials of said first semiconductor layer and said second semiconductor layer forming said super-lattice, and a second field effect transistor having a channel storing holes in a lower one of valence band energy potentials of said first semiconductor layer and said second semiconductor layer forming said superlattice.

3. A semiconductor device according to claim 2, wherein said first semiconductor layer comprises silicon, or an alloy crystal of silicon and germanium, and said second semiconductor layer comprises an alloy crystal of silicon and germanium having a higher germanium content ratio as compared with said first semiconductor layer, or germanium.

4. A semiconductor device according to claim 3, wherein said first semiconductor layer comprises silicon, or an alloy crystal of silicon and germanium, said silicon or an alloy crystal of silicon and germanium containing a tensile strain, and said second semiconductor layer comprises an alloy crystal of silicon and germanium having a higher germanium content ratio as compared with said first semiconductor layer, or germanium, said alloy crystal of silicon and germanium, or germanium containing a compressive strain.

5. A semiconductor device according to claim 1, further comprising a first electrode disposed on one end of said channel of said exposed face, and a second electrode disposed on the other end of said channel of said exposed face.

6. A semiconductor device comprising:
   a semiconductor substrate having a quantum well layer exposed annularly; and
   a first electrode disposed to be insulated from said quantum well layer,
   wherein when a voltage is applied to said first electrode, a conduction channel region which becomes a quantum well having a small width is formed on the exposed face of said quantum well layer exposed annularly.

7. A semiconductor device according to claim 6, wherein said semiconductor substrate has a trench, and consequently said quantum well layer is exposed annularly.

8. A semiconductor device according to claim 7, further comprising a second electrode connected to one end of said conduction channel region, and a third electrode connected to the other end of said conduction channel region.

9. A semiconductor device according to claim 8, wherein said semiconductor substrate has a plurality of trenches and a plurality of first electrodes associated with said trenches, a conduction channel region is formed in each of said plurality of trenches, and a second electrode connected to one end of said conduction channel region and a third electrode connected to the other end of said conduction channel region are formed;
   said third electrode of arbitrary one of said plurality of trenches and said second electrode of an adjacent trench are connected together by conductor wiring; and
   when a voltage is applied to said plurality of first electrodes, said plurality of conduction channel regions are connected in series via said third electrode, said conductor wiring, and said second electrode to form inductance.

10. A semiconductor device according to claim 6, wherein said semiconductor substrate has a columnar projection, and consequently said quantum well layer is exposed annularly.

11. A semiconductor device comprising:
    a semiconductor substrate having at least one island-shaped region and a trench, a quantum well layer being exposed annularly on all side faces of said trench; and
    an electrode formed within said trench, said electrode being disposed to be insulated from said semiconductor substrate having at least one island region,
    wherein when a voltage is applied to said electrode, a conduction channel region which becomes a quantum well having a small width is formed on the exposed face of said quantum well layer exposed annularly.

12. A semiconductor device comprising:
    a semiconductor projection formed on a semiconductor substrate, said semiconductor projection having a quantum well layer inside;

a first electrode formed on a side face of said semiconductor projection to be insulated from said side face of said semiconductor projection;

at least one trench formed on an upper face of said semiconductor projection so as to expose said quantum well layer annularly; and a second electrode formed in said trench to be insulated from said semiconductor projection, wherein when a voltage is applied to said first electrode or said second electrode, an annular conduction channel region which becomes a quantum well having a small width is formed on an face of said quantum well layer opposed to an electrode subjected to voltage application and included in said first electrode and said second electrode.

* * * * *